US008172619B2

(12) United States Patent
Williams

(10) Patent No.: US 8,172,619 B2
(45) Date of Patent: May 8, 2012

(54) SMART CARD HEAT SINK

(75) Inventor: Kevin Michael Williams, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 278 days.

(21) Appl. No.: 12/450,411

(22) PCT Filed: Jun. 20, 2007

(86) PCT No.: PCT/US2007/014461
§ 371 (c)(1),
(2), (4) Date: Sep. 24, 2009

(87) PCT Pub. No.: WO2008/136803
PCT Pub. Date: Nov. 13, 2008

(65) Prior Publication Data
US 2010/0073881 A1    Mar. 25, 2010

Related U.S. Application Data

(60) Provisional application No. 60/927,689, filed on May 4, 2007.

(51) Int. Cl.
*H01R 24/00* (2011.01)
(52) U.S. Cl. ........................................ 439/630
(58) Field of Classification Search .............. 439/159, 439/607.37, 541.5, 64, 607.33, 540.1, 630; 361/704
See application file for complete search history.

(56) References Cited

U.S. PATENT DOCUMENTS

| 5,892,216 | A | | 4/1999 | Grant et al. |
| 5,967,845 | A | * | 10/1999 | Ho et al. ................. 439/607.33 |
| 6,077,119 | A | * | 6/2000 | Yu et al. ................... 439/607.37 |
| 6,109,530 | A | | 8/2000 | Larson et al. |
| 2001/0043462 | A1 | * | 11/2001 | Yamazaki ...................... 361/704 |
| 2005/0074995 | A1 | * | 4/2005 | Kimura et al. ................ 439/159 |

FOREIGN PATENT DOCUMENTS

JP        11008484       12/1999

OTHER PUBLICATIONS

Search Report dated Mar. 5, 2008.

* cited by examiner

*Primary Examiner* — Edwin A. Leon
(74) *Attorney, Agent, or Firm* — Robert D. Shedd; Harvey D. Fried; Richard LaPeruta

(57) ABSTRACT

A heat sink for a smart card, the heat sink having a contact plate having a contact surface, a riser extending upward from the contact plate, and a hook extending upward from the contact plate and located opposite the riser is disclosed. A smart card socket having a frame having a slot for receiving a smart card, the slot being defined by at least one wall, and a smart card heat sink at least partially abutted to the at least one wall is also disclosed. Finally, a method of transferring heat energy away from a smart card, comprising the steps of associating a smart card heat sink with a smart card socket and positioning at least a portion of the smart card heat sink between at least a portion of a smart card and at least a portion of the smart card socket is disclosed.

8 Claims, 3 Drawing Sheets

SMART CARD HEAT SINK

CROSS-REFERENCE TO RELATED APPLICATIONS

This application claims the benefit, under 35 U.S.C. §365 of International Application PCT/US2007/014461, filed Jun. 30, 2007 which was published in accordance with PCT Article 21(2) on Nov. 13, 2008 in English and which claims the benefit of United States provisional patent application No. 60/927,689 filed May 4, 2007.

FIELD OF THE INVENTION

The invention relates to a smart card. In particular, the invention relates to a smart card heat sink.

BACKGROUND OF THE INVENTION

Smart cards are well known electronic devices that most generally comprise a microchip processor, memory, an input/output controller, and a contact arrangement carried onboard a flexible card-like medium. While smart cards are generally designed to meet international standards to ensure compatibility with a wide range of card accepting devices, great variations exist in current smart card use and capability. For example, while some smart cards are designed to perform very low level and non-microchip processor intensive functions, other smart cards employ advanced microchip processor functions and perform microchip processor intensive functions over long periods. As with other electronic devices, smart cards generate heat as a byproduct of their function. Currently, some smart cards generate heat at a high level, rendering the smart card unfit for use in some card accepting devices. For example, smart cards used with satellite television set-top boxes are becoming more complex and performing more functions. However, this increase in functionality is accompanied by an unacceptable level of heat generation and build up within the integrated circuit components of the smart card, the smart card package itself, and a socket of the set-top box which receives the smart card. One attempt to reduce the temperature of the components of the smart card was to include thermal conducting foam on a bottom side of a smart card connector. The thermal conducting foam contacts a bottom of a set-top box to conduct some heat away from the smart card area. However, while there have been many advancements in smart card technology, current smart cards and card accepting devices (particularly smart card sockets) do not adequately transfer heat away from smart cards and card accepting devices.

SUMMARY OF THE INVENTION

The present invention relates to a heat sink for a smart card, the heat sink having a contact plate having a contact surface, a riser extending upward from the contact plate, and a hook extending upward from the contact plate and located opposite the riser. The present invention also relates to a smart card socket having a frame having a slot for receiving a smart card, the slot being defined by at least one wall, and a smart card heat sink at least partially abutted to the at least one wall. The present invention further relates to a method of transferring heat energy away from a smart card, comprising the steps of associating a smart card heat sink with a smart card socket and positioning at least a portion of the smart card heat sink between at least a portion of a smart card and at least a portion of the smart card socket.

DETAILED DESCRIPTION OF THE INVENTION

Figure 1:
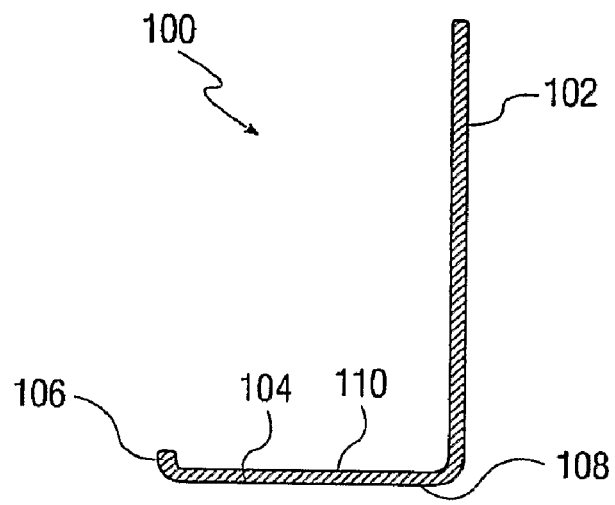
FIG. 1 is an orthogonal cross-sectional view of a smart card heat sink according to the present invention.

Referring now to FIG. 1 in the drawings, a smart card heat sink according to the present invention is illustrated. Specifically, a smart card heat sink 100 is shown as having a cross-sectional form that is substantially J-shaped. Substantially J-shaped is intended to include the embodiment in which the bottom portion of the J-shape is flat. The smart card heat sink 100 comprises a substantially vertical riser 102 extending up from one side of a contact plate 104 and an upturned hook 106 extending up from a side of the contact plate 104 opposite the vertical riser 102. In one embodiment, the riser 102 extends upward from the contact plate 104 a greater distance than the hook 106 extends upward from the contact plate 104. The smart card heat sink 100 further comprises a contact face 108 that is the lower side of the contact plate 104 and a connection face 110 that is the upper side of the contact plate 104. The smart card heat sink 100 is generally formed of steel by bending a single sheet or plate of steel to form the cross-sectional shape illustrated in FIG. 1. However, it will be appreciated that in other embodiments of the present invention, the smart card heat sink may be substantially differently shaped and may be constructed, in part or in whole, of a material other than steel. Whatever material is chosen, the material should be suitable for thermal energy transfer.

Figure 2:
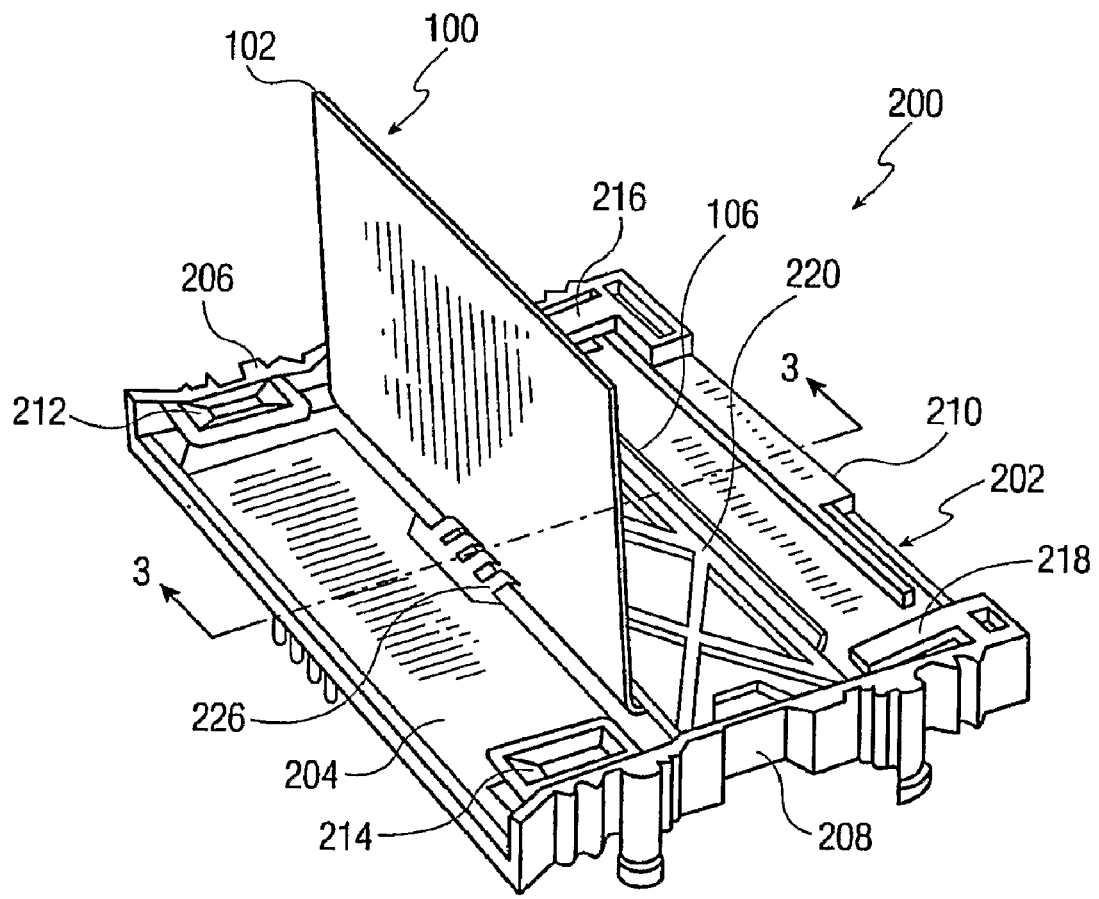
FIG. 2 is an oblique view of a smart card socket according to the present invention.
Figure 3:
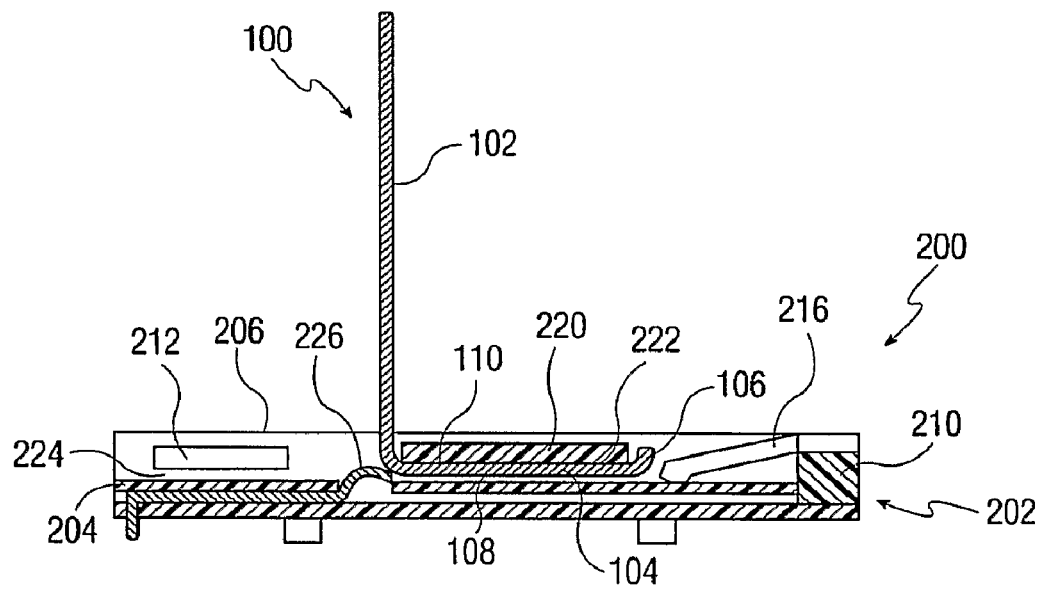
FIG. 3 is an orthogonal cross-sectional view taken at cutting line 3-3 of FIG. 1 of the smart card socket of FIG. 2.

Referring now to FIGS. 2 and 3 in the drawings, a smart card socket according to the present invention is illustrated. Specifically, a smart card socket 200 comprises a frame 202 shaped and sized to receive at least a portion of a conventional smart card (discussed infra and which generally is the size a typical credit card). The frame 202 comprises a base 204, a left sidewall 206 extending up from a left side of the base 204, a right sidewall 208 extending up from a right side of the base 204, and a rear wall 210 extending up from a rear side of the base 204. Smart card socket 200 further comprises a left forward alignment tab 212 extending from the left sidewall 206 toward the right sidewall 208 and a right forward alignment tab 214 extending from the right sidewall 208 toward the left sidewall 206. Further, smart card socket 200 comprises a left rear retention tab 216 extending from the left side of the rear wall 210 toward the front of the frame 202 and a right rear retention tab 218 extending from the right side of the rear wall 210 toward the front of the frame 202. Smart card socket 200 also comprises a crossbar 220 extending from the left sidewall 206 to the right sidewall 208.

The innermost faces of the base 204, left sidewall 206, right sidewall 208, rear wall 210, and an underside 222 (shown in FIG. 3) of crossbar 220 generally define a slot 224 for receiving a smart card into the frame 202 of the smart card socket 200. An underside of each left and right forward alignment tabs 212 and 214 also delimits the slot 224. Further, left and right rear retention tabs 216 and 218 are biased to accept a smart card between each of the tabs 212 and 214 and the base 204. Specifically, the tabs 212 and 214 are biased toward the base 204. Further, resilient contacts 226 are carried by base 204 and protrude upward and out of base 204 into slot 224.

Figure 4:
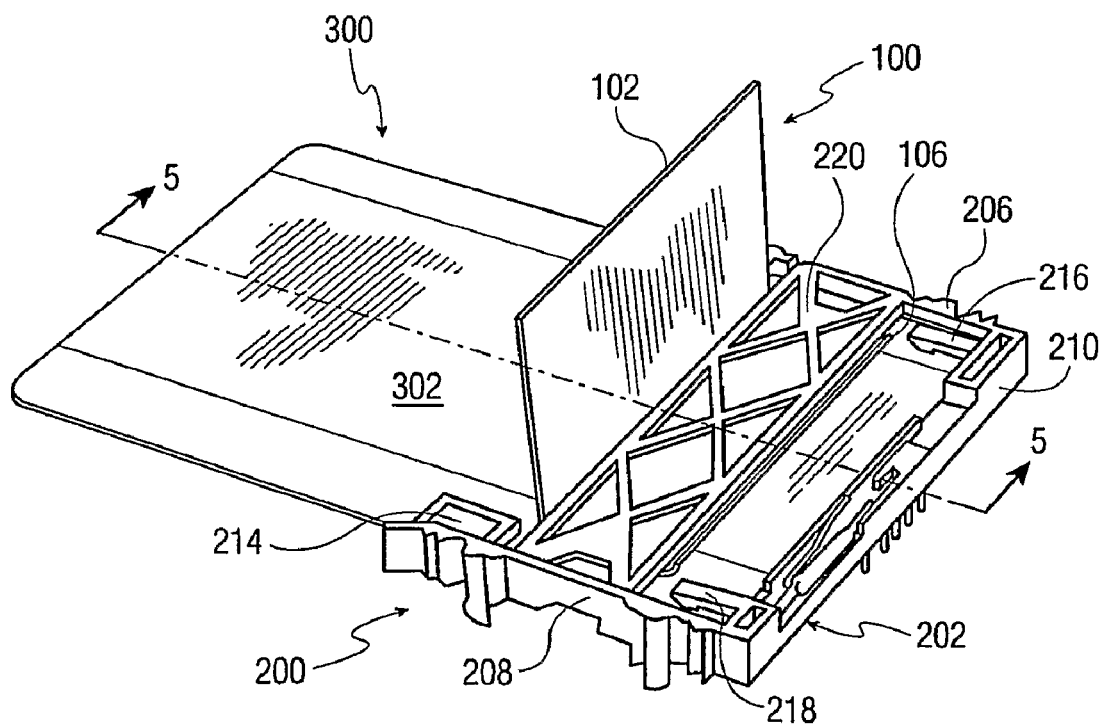
FIG. 4 is an oblique rear view of the smart card socket of FIG. 2 having a smart card inserted into the smart card socket.
Figure 5:
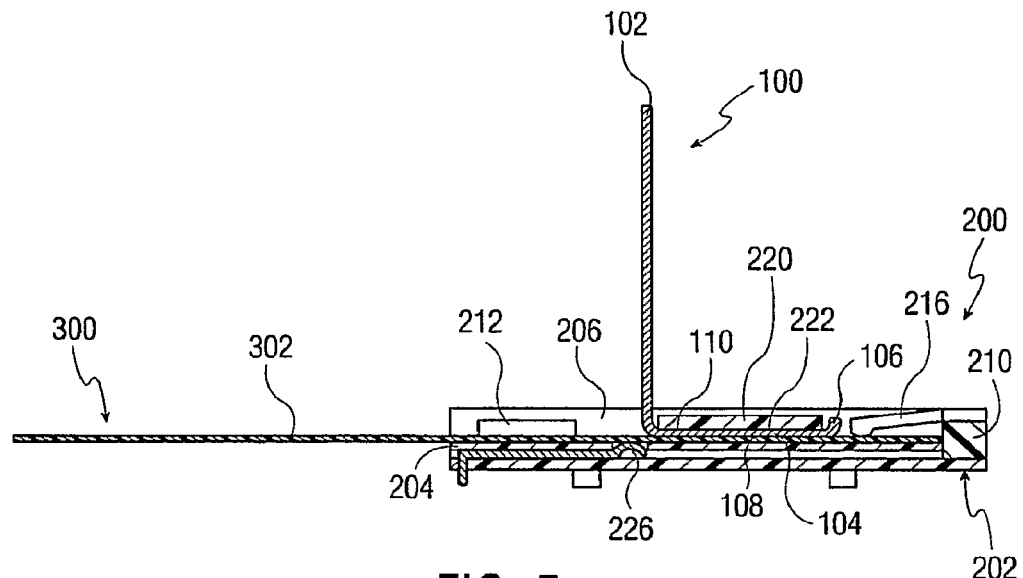
FIG. 5 is an orthogonal cross-sectional view taken at cutting line 5-5 of FIG. 4 of the smart card socket of FIG. 2.
Figure 6:
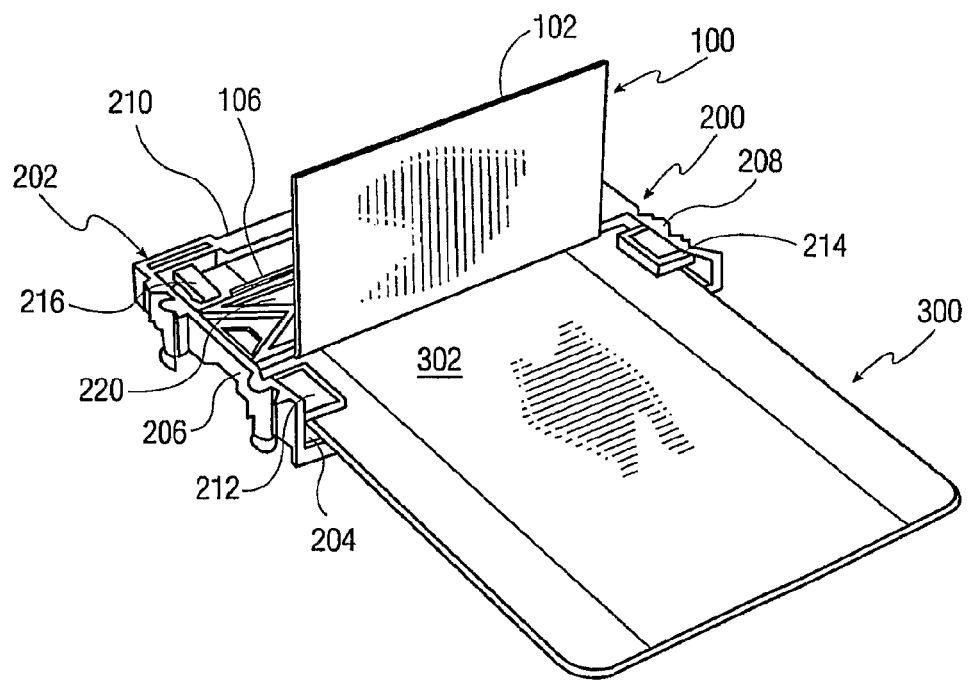
FIG. 6 is an oblique front view of the smart card socket of FIG. 2 having a smart card inserted into the smart card socket.

FIGS. 2 and 3 show smart card socket 200 without a smart card installed while FIGS. 4-6 show smart card socket 200 with a smart card 300 installed. Smart card 300 comprises a heat conductive face 302 that is generally thermally connected to heat generating components within the smart card 300 (not shown).

In operation, the smart card heat sink 100 is assembled with smart card socket 200 by inserting contact plate 104 of smart card heat sink 100 into slot 224 so that connection face 110 of the contact plate 104 is substantially pressed against the underside 222 of crossbar 220. As shown in FIG. 2, riser 102 is located forward of the contact plate 104 nearer the front of smart card socket 200. Further, hook 106 is located rearward from the contact plate 104 nearer the rear wall 210. While not shown, smart card heat sink 100 may be adhered, riveted, or otherwise fastened to frame 202. Specifically, an adhesive agent may be disposed between connection face 110 and underside 222 of crossbar 220. It will be appreciated that in other embodiments of the present invention, differently shaped smart card heat sinks and differently shaped frames are considered within the scope of the present invention. Further, it will be appreciated that in other embodiments of the present invention, a smart card heat sink may be formed integral to a frame of a smart card socket.

After associating a smart card heat sink 100 with the smart card socket 200 in the above-described manner, the smart card 300 is inserted into the slot 224 of smart card socket 200 in an insertion direction from the front of the smart card socket 200 toward the rear wall 210. Specifically, smart card 300 is initially partially inserted into slot 224 and generally bounded by base 204, left sidewall 206, right sidewall 208, left forward alignment tab 212, and right forward alignment tab 214. Next, as smart card 300 is further advanced into the slot 224, heat conductive face 302 of smart card 300 contacts contact face 108 of contact plate 104. In this position, smart card 300 has forced protruding portions of resilient contacts 226 downward toward base 204. The contact plate 104 can be positioned or sandwiched between at least one wall of the smart card socket 200 and the smart card 300. One advantage of upward extending riser 102 is that as smart card 300 is inserted into slot 224, the riser 102 provides a natural interference with a portion of the smart card socket such as crossbar 200 and further prevents rearward movement of the smart card heat sink 100. Similarly, while removing smart card 300 from slot 224, the hook 106 provides a naturally interference with a portion of the card socket such as crossbar 220 and further prevent forward movement of the smart card heat sink 100.

Finally, when smart card 300 is fully seated within the frame 202 of smart card socket 200, the smart card 300 generally abuts rear wall 210 and is releasably retained by left and right rear retention tabs 216 and 218 pressing downward on smart card 300 toward base 204. In this final position, substantially all of contact face 108 of smart card heat sink 100 is in thermal contact with heat conductive face 302 of smart card 300 and resilient contacts 226 are electrically connected to electrical contacts of the smart card 300 (not shown). The structural components of frame 202 are sized and shaped so that, in this final position where smart card 300 is sandwiched between frame 202 and smart card heat sink 100, smart card 300 is firmly held between base 204 and contact face 108, ensuring a suitable thermal connection between heat conductive face 302 and contact face 108.

In this embodiment, this thermal connection allows transfer of heat energy from smart card 300 to smart card heat sink 100 and allows a reduction of smart card internal component (not shown) temperature of about 5° C. or more. However, it will be appreciated that the reduction in temperature may be affected by increasing or decreasing the amount of surface area contact between the heat conductive face 302 and contact face 108, constructing the heat sink 100 of a different material, and increasing or decreasing the forces that press the smart card 300 to the smart card heat sink 100. It will further be appreciated that in alternative embodiments, the heat conductive face of the smart card may be differently located on the smart card. For example, the heat conductive face may include the front, rear, lower, or side faces of the smart card, and a differently shaped heat sink may be provided for thermally contacting any one or combination of the faces of the smart card such thermally conductive face 302.

The above-described operations illustrate a method of transferring heat energy away from a smart card. Specifically, the method comprises associating a smart card heat sink with a smart card socket (optionally integrally) and sandwiching at least a portion of the smart card heat sink between at least a portion of a smart card and at least a portion of the smart card socket. In one embodiment, at least a portion of the smart card heat sink is not positioned or sandwiched between the smart card and the smart card socket.

The foregoing illustrates only some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

The invention claimed is:

1. A smart card socket, comprising:
   a frame having a slot for receiving a smart card, the slot being defined by at least a left side wall and a right side wall and a crossbar that extends between the left side wall and the right side wall;
   a smart card heat sink having a contact plate, at least a portion of the contact plate abuts the crossbar such that the portion of the contact plate is positioned between the crossbar and the slot.

2. The smart card socket according to claim 1, wherein a contact surface of the contact plate is thermally connected to a thermally conductive face of a smart card in the slot.

3. The smart card socket according to claim 1, the heat sink comprising:
   a riser extending upward from the contact plate; and
   a hook extending upward from the contact plate and located opposite the riser.

4. The smart card socket according to claim 3, wherein the heat sink has a substantially J-shaped cross-sectional shape.

5. The smart card socket according to claim 3, wherein the riser extends upward from the contact plate a greater distance than the hook extends upward from the contact plate.

6. The smart card socket according to claim 3, wherein the contact plate is configured for contacting a thermally conductive face of the smart card.

7. The smart card socket according to claim 3, wherein the riser prevents a movement of the heat sink with respect to the smart card socket by interfering with a portion of the smart card socket.

8. The smart card socket according to claim 3, wherein the hook prevents a movement of the heat sink with respect to the smart card socket by interfering with a portion of the smart card socket.

* * * * *